(12) United States Patent
Clark et al.

(10) Patent No.: US 6,441,601 B1
(45) Date of Patent: Aug. 27, 2002

(54) PHASE METER USING A PERMUTER

(75) Inventors: James M. Clark, Verona, NJ (US); John E. Petzinger, San Diego, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 4 days.

(21) Appl. No.: 09/711,176

(22) Filed: Nov. 13, 2000

Related U.S. Application Data

(60) Provisional application No. 60/164,953, filed on Nov. 12, 1999, and provisional application No. 60/164,954, filed on Nov. 12, 1999.

(51) Int. Cl.[7] .............................................. G01R 25/00
(52) U.S. Cl. .................................. 324/76.52; 324/76.58
(58) Field of Search ........................... 324/76.52, 76.53, 324/76.55, 76.58, 76.68, 76.82; 375/362, 355, 371

(56) References Cited

U.S. PATENT DOCUMENTS

| | | | | |
|---|---|---|---|---|
| 3,185,958 A | * | 5/1965 | Masterson et al. | 360/6 |
| 3,777,133 A | * | 12/1973 | Beck et al. | 324/76.33 |
| 3,787,765 A | * | 1/1974 | Morrow et al. | 324/76.83 |
| 4,001,682 A | * | 1/1977 | Watt | 324/76.47 |
| 4,654,586 A | * | 3/1987 | Evans et al. | 324/76.47 |
| 4,712,060 A | * | 12/1987 | Bailey et al. | 324/76.77 |
| 4,885,554 A | * | 12/1989 | Wimmer | 327/157 |
| 5,345,440 A | * | 9/1994 | Gledhill et al. | 370/210 |
| 5,535,237 A | * | 7/1996 | LaPadula et al. | 342/352 |
| 6,307,868 B1 | * | 10/2001 | Rakib et al. | 370/485 |
| 6,339,611 B1 | * | 1/2002 | Antonio et al. | 342/361 |

\* cited by examiner

*Primary Examiner*—N. Le
*Assistant Examiner*—Vincent Q. Nguyen
(74) *Attorney, Agent, or Firm*—Epstein, Edell, Shapiro Finnan & Lytle, LLC

(57) ABSTRACT

A phase meter measures the phase of a first signal with respect to a second signal, where the first and second signals have different frequencies and the frequency of the first signal is higher than the frequency of the second signal. The phase meter samples the first signal using the second signal to produce a plurality of samples, where each sample has a sample phase and value. The phase meter permutes the plurality of sample phases to place their phase positions in phase order, and determines, for each permuted sample phase if the sample phase is within a phase range corresponding to a predetermined phase bin. If the sample is within a phase range for a phase bin, a bin counter for that bin in incremented. The phase of the faster signal is determined based on the counts in each of the phase bins.

8 Claims, 17 Drawing Sheets

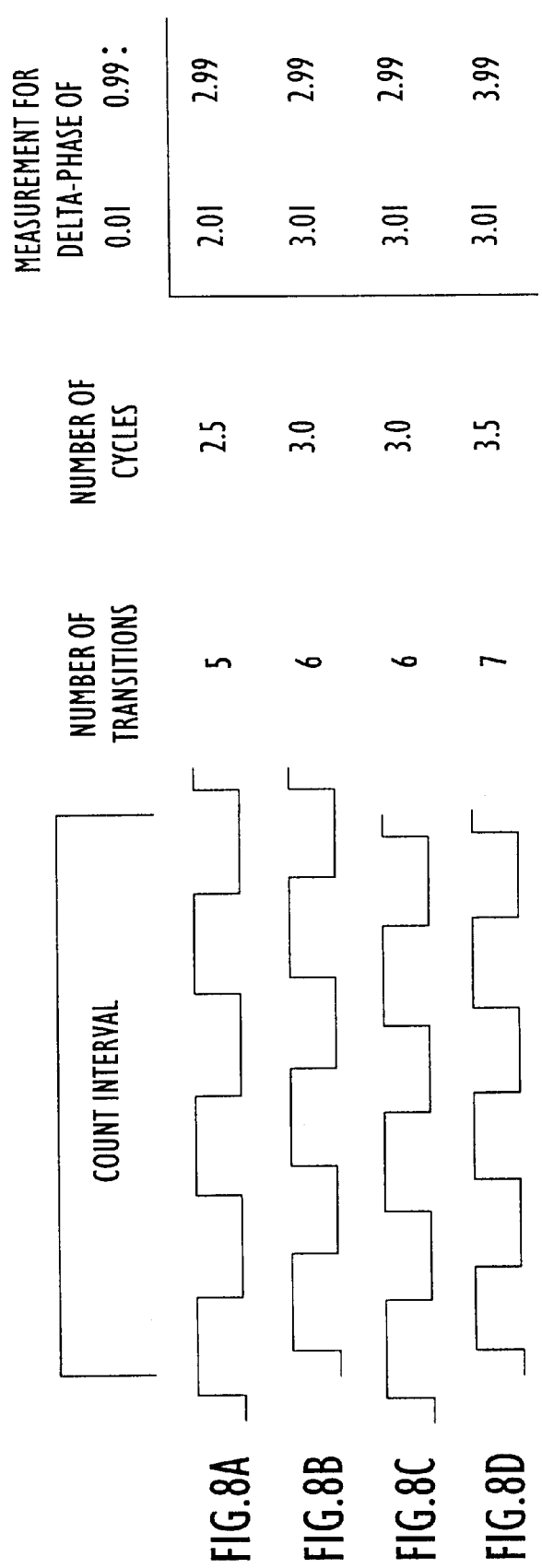

| | A | B | C | | | | | | | |
|---|---|---|---|---|---|---|---|---|---|---|
| | 100 | 50 | 0 | 0 | B-A+50 |
| | 50 | 100 | 0 | 100 | C-A+150 |
| | 0 | 100 | 50 | 200 | C-B+250 |
| | 0 | 50 | 100 | 300 | A-B+350 |
| | 50 | 0 | 100 | 400 | A-C+450 |
| | 100 | 0 | 50 | 500 | B-C+550 |
| | 100 | 50 | 0 | 600 | |

FIG.17

PHASE METER USING A PERMUTER

CROSS REFERENCE TO RELATED APPLICATION

This application claims priority from U.S. Provisional Patent Application Serial Nos. 60/164,953, entitled "Phase Meter, Using A Permuter And Bin Counters," and Ser. No. 60/164,954, entitled "Phase Meter, Using A Permuter And Matched Filter," both filed Nov. 12, 1999. The disclosures of these provisional patent applications are incorporated herein by reference in their entirety.

BACKGROUND OF THE INVENTION

1. Field of the Invention

The present invention relates to timing systems, and, more particularly, to methods and apparatuses for measuring phase differences between signals and adjusting interval counters based on the measured phase differences.

2. Description of the Related Art

Timing and digital communication systems routinely use internal clocks to generate reference signals. Those systems use the reference signals to keep time and to generate other signals and codes used to communicate with other devices. In such systems there is a need to know the phases of the internal clocks to synchronize them with other clocks in transmitters and receivers in the communications system.

One timing system that uses frequency standards as timing sources is the Global Positioning System (GPS). The GPS system is a satellite-based spread-spectrum communications system that transmits coded signals from the satellites for use by receivers to determine their position and the time. The GPS satellites use redundant atomic frequency standards (AFS), i.e., atomic clocks, on each satellite as the basis for accurate timing with long-term stability. The atomic frequency standards include Cesium beam frequency standards, or Rubidium based frequency standards. In the GPS satellites the AFS signal is a very accurate signal with a frequency of nearly 13.4 MHz. However, the AFS frequency is determined by the physical attributes of the Cesium or Rubidium atoms, and is not precisely related by any simple ratio of integers to common time-keeping, which is based on the rotation of the earth. Furthermore, the atomic frequency standards are not easily tuned (adjusted).

Each GPS satellite also uses a less stable, but adjustable frequency source, namely, a voltage-controlled crystal oscillator (VCXO) to generate a 10.23 MHz "system clock" which is used to generate timing signals used in the satellite to control the timing of navigation signals broadcast from the satellites. Although the system clock is not sufficiently stable by itself, it is adjustable; and by continually adjusting it using information obtained by comparison with the AFS frequency, the adjusted system clock can obtain the stability of the AFS. By comparing the 10.23 MHz system clock with the very accurate 13.4 MHz AFS clock signal, errors in the system clock can be determined and adjusted. Each GPS satellite uses a phase meter to compare these two clocks and to adjust the system clock. The phase meter data can also be used to monitor the AFS performance, to adjust the satellite timing to follow a world-wide time standard, and/or to create an ensemble clock, that is, to average the timing of multiple atomic clocks from one or more satellites, thus obtaining a virtual clock that is better than any one atomic clock alone.

In many applications, such as in GPS, the phase of a signal and its phase change must be measured with a high degree of precision because of the need to generate the highly stable frequency signals. In some applications where transmitters and receivers are widely distributed and those devices must remain closely synchronized for communications or other purposes, phase meters can be used to help maintain that synchronization. However, in many instances the precision of conventional phase meters is inadequate, thereby inhibiting the development of such systems. In other cases, high precision phase meters are too expensive for certain applications, or the technology used to build conventional high precision phase meters is incompatible with more economical technologies, thereby hindering large scale integration (LSI) of the phase meter.

Conventional methods for detecting a phase difference between two frequency signals, such as the 10.23 MHz GPS system clock and the 13.4 MHz AFS clock, use another clock signal that is very fast with respect to both of the other two frequency signals. Time is measured by counting the cycles of the very fast clock. That fast clock, however, must be as fast as possible, and thus becomes very expensive to achieve even modest precision. A problem with using the fast clock is that the logic technology enabling the clock to operate so fast is expensive making it infeasible to combine that fast logic with more economical logic technology used in large scale integration (LSI). That fast logic technology also consumes more power than does slower, more conventional logic technologies. An effect of the increased power consumption is that the size and weight of ancillary components such as power supplies and drivers must be increased. As a result, the fast logic required by conventional phase meters inhibits the integration of those phase meters with other less expensive logic technology. It also makes it infeasible to include additional phase meters in the satellite for measuring the phase of other signals such as the output of a back-up atomic clock.

Accordingly, there is a need to measure two or more clock frequency signals precisely and economically without requiring use of a faster clock signal in the measurement.

SUMMARY OF THE INVENTION

Therefore, in light of the above, and for other reasons that become apparent when the invention is fully described, an object of the present invention is to measure the phase of a signal with a high degree of precision, using signals with lower frequencies than the measured signal.

Another object of the present invention is to integrate a phase meter with other circuits using inexpensive logic technology.

A further object of the present invention is to measure the phase of signals using a phase meter that consumes little power.

Yet a further object of the present invention is to measure a phase difference between two signals without storing a plurality of phase samples.

A still further object of the present invention is to measure a phase difference between two signals using a phase meter with reduced size and weight.

Yet another object of the invention is to facilitate use of multiple phase meters.

The aforesaid objects are achieved individually and in combination, and it is not intended that the present invention be construed as requiring two or more of the objects to be combined unless expressly required by the claims attached hereto.

In accordance with one aspect of the invention, a phase meter measures a phase of two signals by sampling the faster signal with the slower signal, and permuting the phase positions of the samples. For each permuted sample phase position the phase meter determines a phase bin with a phase range encompassing the phase of the sample. For each phase bin the phase meter counts the number of samples with a value of "1" that are within the bin's phase range. Based on the bin counts, the phase meter determines the phase of the first signal according to a formula relating to the bin counts.

In accordance with another aspect of the invention, a phase meter includes sampler that samples a first signal with a second signal, where the first signal has a higher frequency than the second signal. The phase meter also includes a permuter that permutes phase positions of the second signal. A bin assigner is connected to the permuter and sampler, and compares the permuted phase values with a plurality of phase ranges corresponding to phase bins. The bin assigner selects a phase bin for the permuted sample based on the sample phase and the phase ranges of the phase bins. Each phase bin has a bin counter associated with it that counts in response to receiving a signal from the bin assigner indicating that a sample has a phase within the bin's phase range. A pattern finder determines a phase evaluation formula based on the counts in the bin counters, and a phase evaluator evaluates the phase difference between the first and second signals according to the determined phase evaluation formula and the bin counts, and outputs a phase measurement signal.

The above and still further objects, features and advantages of the present invention will become apparent upon consideration of the following descriptions and descriptive figures of specific embodiments thereof. While these descriptions go into specific details of the invention, it should be understood that variations may and do exist and would be apparent to those skilled in the art based on the descriptions herein.

BRIEF DESCRIPTION OF THE DRAWINGS

FIGS. 8A–D are waveform diagrams showing various phase offsets of a signal within a count interval.

FIG. 17 is a phase comparison diagram showing bin count percentages.

DESCRIPTION OF THE PREFERRED EMBODIMENTS

Figure 2:
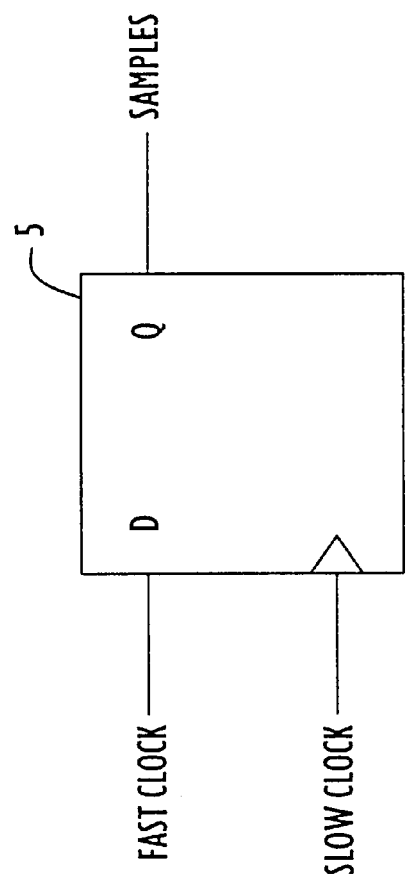
FIG. 2 is a diagram of a sampler according to the invention.

Preferred embodiments according to the present invention are described below with reference to the above drawings, in which like reference numerals designate like components.

Overview

Most phase meters compare clocks of equal (or nearly equal) frequency, or are easily adapted when, for example, one clock is twice the frequency of the other. For example, the faster clock can be divided by two to get equal clocks to compare. However, there is a need to compare the phase of signals that have very different frequencies, that are not easily measured merely by dividing the frequency of one signal to obtain the frequency of another signal. An example of this need is with GPS satellites where the phase of the 10.23 MHZ system clock must be measured with respect to the 13.4 MHZ AFS signal. The present invention enables such phase measurements when the clock frequencies to be measured are unequal and very different from one another. Most conventional digital phase measurement methods typically use counters, and require the measurement logic to run much faster than the clocks being measured. This limits the applicability to slow clocks. A phase meter according to the present invention can run slower than the clocks being measured. The smallest measurable time achieved by a phase meter according to the invention is much smaller than the period of any of the clocks used, and hence, a high degree of precision is achieved by the inventive phase meter. Conventional phase meters also require the measurement process to extend over a very large number of clock cycles in proportion to the desired precision. The inventive phase meter makes measurements more quickly, allowing observation of faster phase changes.

An application of the phase meter according to the invention is to measure with extraordinary precision the phase between clocks with dissimilar frequencies. Another application of the phase meter is to adjust an interval counter to avoid ambiguous counts.

Although two exemplary clocks are referred to in the descriptions below, namely the "10.23 MHZ system clock"

and the "13.4 MHZ AFS clock", the invention is not limited to only measuring signals of those frequencies. Rather, those frequencies are used here merely to illustrate the invention. More generally, the inventive phase meter directly applies to any two clocks with very different frequencies F1 and F2, in which the ratio F1/F2 is not exactly equal to any ratio of integers N1/N2 where N1 and N2 are small relative to the desired precision.

In a situation where the two clock frequencies are not very different the phase meter can be indirectly applied as follows. An oscillator with frequency F3 can be added to the system, with F3 chosen such that F1 and F3 are very different, and F2 and F3 are very different. The oscillator should have good short-term stability, but need not be accurate. Use two phase meters, one to measure the phase difference between F1 and F3, and the another to measure the phase difference between F2 and F3. Subtract those measured phase differences to determine the phase difference between F1 and F3.

Figure 1:
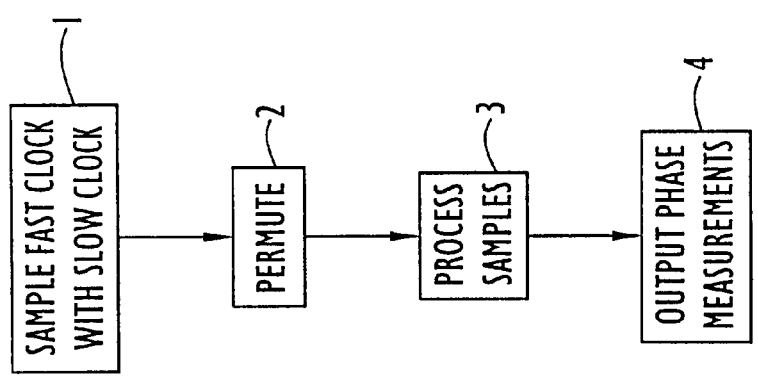
FIG. 1 is a flow diagram illustrating the major operations in measuring a signal's phase according to the invention.

The phase meter here generally operates according to the flowchart shown in FIG. 1. The phase meter will measure the phase difference between two signals with different frequencies, F1 and F2. One of those signals will have a lower frequency F1 than the frequency F2 of the other signal. Hence, the signal with the higher frequency F2 is referred to as the fast clock, and the signal with the lower frequency F1 is referred to as the slow clock. In operation 1, shown in FIG. 1, the slow clock is used to sample the fast clock. This sampling produces a set of samples of the fast clock, where the samples have a value (i.e., a "1" or a "0"), and an associated sampling time, or phase position within a cycle of the fast clock. In operation 2 the samples are permuted, as discussed in more detail below. Permuting arranges the samples in a convenient order to assist processing the samples. The permuted samples are processed in operation 3 to determine the phase of the fast clock with respect to the slow clock, and in operation 4 the phase meter outputs a phase measurement.

An interval counter counts the number of cycles of the "AFS clock" that occur in so many cycles of the "system clock" (15,345,000 cycles, in this case, called an 'epoch'), which is a frequency ratio measurement. This is not actually an integer, but a counter will, of course, provide only an integer, which approximates the true value. Suppose 100 such measurements are made, starting the next measurement the moment that each measurement is completed. The sum of the 100 counts should be the same as if one continuous measurement were made, but because of the approximations, the sum may be 50, perhaps 100, too high, or equally low. An application of the phase meter is described that adjusts the interval counter so that the sum of counts is just as accurate as if done as one continuous count. In fact, the difference of the phase measurements taken at the beginning and at the end of the counting interval may be interpreted as a fraction to be added to the adjusted count, such that the count plus fraction more closely approximates the true value of the interval.

Sampling

The phase meter uses the slow clock having a frequency F1 to sample the fast clock having a frequency F2. In the case of a GPS satellite, the 10.23 MHZ system clock is used to sample the 13.4 MHZ AFS clock. The samples are bits indicating the state of the AFS clock at the rising edge of the system clock. The sampler can be an edge-triggered flip flop 5 as shown in FIG. 2. Here, the slower clock is connected to the clock input of the flip flop 5 and the faster clock is connected to the data input D, so that the slower clock samples the faster clock. The sample value output at Q is the state of the faster clock at the rising edge of the slower clock.

Alternatively, other clocking methods can be used for the slow clock to sample the fast clock, such as using the falling edge of the slower clock to trigger the sampling of the faster clock.

Permutation

The phase meter permutes the samples to assist in sorting and processing the samples. The permutation relates to the ratio of frequencies of the two clock signals. To perform the permutation the phase meter logic approximates the ratio of the frequency of the slow clock, F1 and the frequency of the fast frequency F2. That is, the phase meter approximates the ratio F2/F1. In the case of a phase meter for use on a GPS satellite, the phase meter approximates the ratio of the 10.23 MHZ system clock and 13.4 MHZ AFS signal with the ratio 131/100. It is noted that this ratio is 3.28 ppm too low for the Rubidium AFS (RAFS), and 71.80 ppm too high for the Cesium AFS (CAFS). This integer ratio of 131/100 applies only to the particular frequencies of the example discussed here. More generally, for each application of the phase meter an appropriate pair of integers (C2/C1) will be used to approximate the ratio F2/F1, where C2 is larger than C1.

Figure 3:
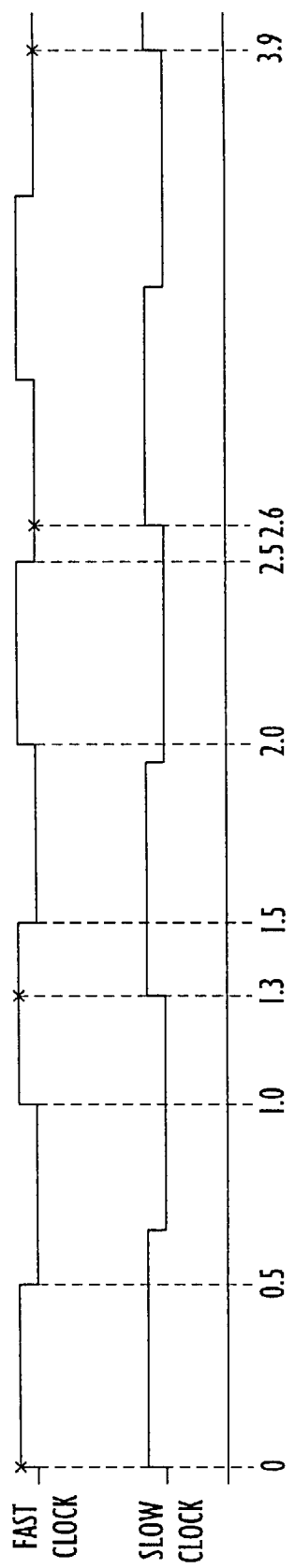
FIG. 3 is a timing diagram illustrating a slow clock sampling a faster clock.

To illustrate how the permutation operates, consider a scaled down version of the integer ratio from 131/100 to 13/10 to make the examples easier to follow. For a point of reference, define time=0 at a point where the rising edges of both clocks align. For convenience, use one AFS cycle as the unit of time, and then the AFS clock will have rising edges at times 0.0, 1.0, 2.0, 3.0, etc. and falling edges at times 0.5, 1.5, 2.5, 3.5, etc., as shown in FIG. 3. If the frequency ratio is actually 13/10, then the system clock will have rising edges at times that are multiples of 1.3. Accordingly, at a rising edge of the system clock the flip flop shown in FIG. 2 is clocked causing the AFS clock input at D to be output at Q, thereby sampling the AFS clock. Those sample points are shown in FIG. 3 with an "x", and the sampling times are set forth in Table 1 below. The table is arranged so as to read the columns in the downward direction, then each row from left to right.

TABLE 1

| | | | Sample times for 13/10 frequency ratio |
|---|---|---|---|
| 0.0 | | | |
| 1.3 | 5.2 | 9.1 | |
| 2.6 | 6.5 | 10.4 | |
| 3.9 | 7.8 | 11.7 | |
| | | 13.0 | |

When using the rising edge of the system clock to sample the AFS clock, the sample at time 0.00 will indicate whether the phase is leading or lagging from phase 0.0, the sample at time 1.3 whether leading or lagging from phase 0.3, the sample at 2.6 relative to phase 0.6, etc. For example, the AFS clock phase would need to lag 0.3 cycles to move the rising edge at 1.0 past the sampling time 1.3.

The phases associated with these samples are in each case the integer part of the sampling times. This is illustrated below in Table 2.

TABLE 2

| 0.0 | | | Sample phases for 13/10 frequency ratio |
|---|---|---|---|
| 0.3 | 0.2 | 0.1 | |
| 0.6 | 0.5 | 0.4 | |
| 0.9 | 0.8 | 0.7 | |
| | | 0.0 | (repeats) |

If the table is read by rows right to left, then top to bottom, the phases are in order, and increase by even increments of 0.1 cycles. It should now be apparent that the reason the times and phases are listed in rows and columns this way is to allow an easy visual permutation of the sample sequence. This permutation sequence can be obtained by incrementing by 13 modulo 10, and is useful for arranging the samples in phase order.

However, suppose the actual frequency ratio differs slightly from 13/10; for example, suppose that it is actually 131/100. Then the sample times will be:

TABLE 3

| 0.00 | | | Sample times for 131/100 frequency ratio |
|---|---|---|---|
| 1.31 | 5.24 | 9.17 | |
| 2.62 | 6.55 | 10.48 | |
| 3.93 | 7.86 | 11.79 | |
| | | 13.10 | | and the corresponding phases will be:

TABLE 4

| 0.00 | | | Sample phases for 131/100 frequency ratio |
|---|---|---|---|
| 0.31 | 0.24 | 0.17 | |
| 0.62 | 0.55 | 0.48 | |
| 0.93 | 0.86 | 0.79 | |
| | | 0.10 | (repeats with 0.1 offset) |

If the phases are read in the same order as before, by rows leftward from top to bottom, they remain an increasing sequence that is nearly even spaced, but the spacing is more uneven. The uneven spacing of samples is a source of deterministic error, but in the actual design and for typical frequency deviations (even for cold start situations), this error is much less than the quantization error. Clock jitter can also contribute error, but only for samples that are close to an edge.

includes a sampler 6, receiving two clock signals, in this example a 13.4 MHZ AFS clock and a 10.23 MHZ system clock, a phase meter 7 that includes a permuter 8 and a matched filter 9, and an interval counter 10. The system also includes a count adjustment unit 11 for combining the outputs of the phase meter and the interval counter to obtain an interval measurement with the resolution of the phase meter and the range of the interval counter. The phase meter is also able to measure the duty-cycle of the AFS clock, which is useful as an indication of integrity of the phase measurement. The count adjustment unit adjusts the count to remove phase ambiguities.

The phase measurement system will be understood to encompass both hardware and software components.

Phase Meter

The phase meter 7 approximates the ratio of the 10.23 MHZ system clock and 13.4 MHZ AFS signal by the ratio 131/100. In this example, 100 successive samples are taken, and those samples are permuted by moving the ith sample to the jth position, where $j=31*i$ modulo 100. The inverse permutation, $i=71*j$ modulo 100, may also be used, depending on whether the choice is made to have the source position a function of the destination position, or vice versa. The permuted samples include approximately a string of 50 ones followed by a string of 50 zeros in a cyclic sequence, with the phase of this sequence approximating the phase between the two clocks.

Permuter

The permuter 8 changes the sequence of C1 samples, where the positions of the samples before being permuted are designated by $i=0, 1, 2 \ldots C1-1$, and the positions of the samples after being permuted are designated by $j=0, 1, 2 \ldots C1-1$. More generally, the permutations are performed in this embodiment according to the equations $j=A*i$ modulo C1 and $i=B*j$ modulo C1, where $A=C2$ modulo C1 and where $B=(1/C2)$ modulo C1 (that is, $B*C2$ modulo $C1=1$).

For example (for C2=131 and C1=100), the equation $j=31*i$ modulo 100 is used to compute Table 5 shown below.

TABLE 5

| i | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | etc. |
|---|---|---|---|---|---|---|---|---|---|---|---|---|---|---|---|---|---|---|---|---|---|---|---|---|---|---|
| j | 0 | 31 | 62 | 93 | 24 | 55 | 86 | 17 | 48 | 79 | 10 | 41 | 72 | 3 | 34 | 65 | 96 | 27 | 58 | 89 | 20 | 51 | 82 | 13 | 44 | etc. |

Sample, Permute and Detect with Matched Filter

Figure 4:
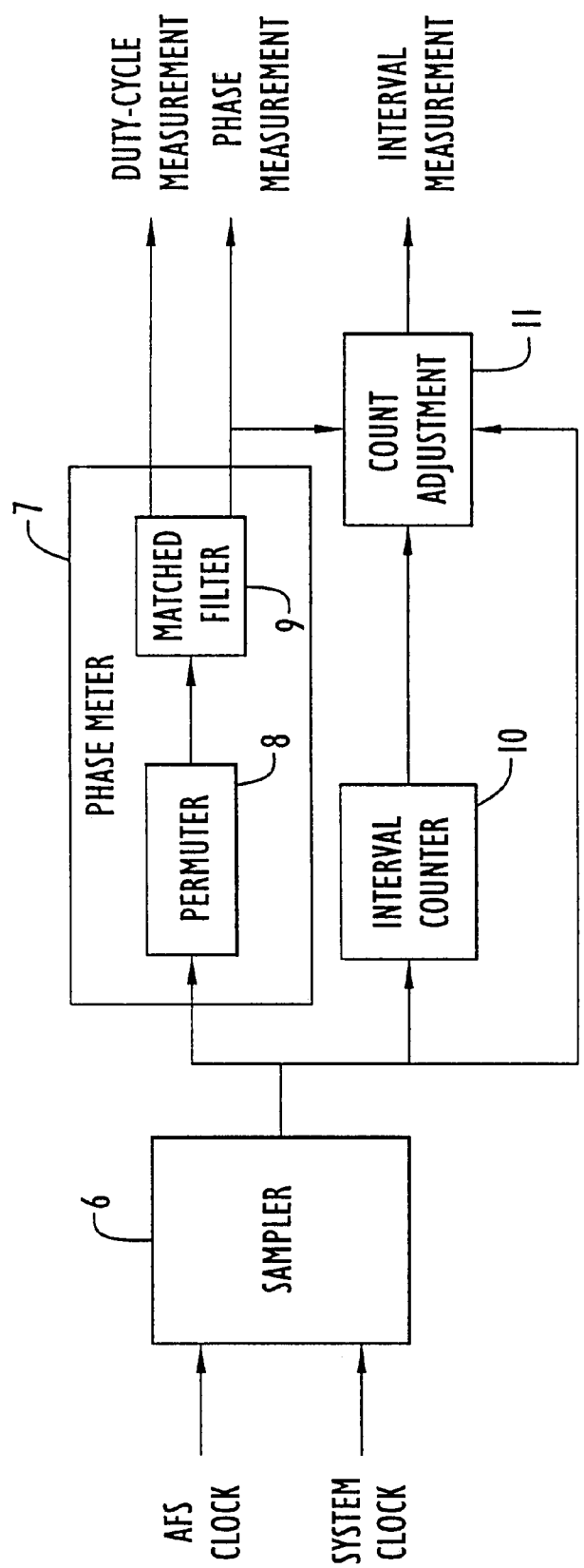
FIG. 4 is a clock diagram of a phase meter according to a first embodiment of the invention.

A phase measurement system according to an embodiment of the invention is shown in FIG. 4. The system Alternatively, the equation $i=B*j$ modulo C1 can be used to compute the position values shown in Table 6 shown below.

TABLE 6

| j | 0 | 1  | 2  | 3  | 4  | 5  | 6  | 7  | 8  | 9  | 10 | 11 | 12 | 13 | 14 | 15 | 16 | 17 | 18 | 19 | 20 | 21 | 22 | 23 | 24 | etc. |
|---|---|----|----|----|----|----|----|----|----|----|----|----|----|----|----|----|----|----|----|----|----|----|----|----|----|------|
| i | 0 | 71 | 42 | 13 | 84 | 55 | 26 | 97 | 68 | 39 | 10 | 81 | 52 | 23 | 94 | 65 | 36 | 7  | 78 | 49 | 20 | 91 | 62 | 33 | 4  | etc. |

Tables 5 and 6 as shown are not complete, but it can be verified that they are correct for some values:

the sample at i=0 is moved to j=0, the sample at i=4 is moved to j=24, the sample at i=7 is moved to j=17, the sample at i=10 is moved to j=10, the sample at i=13 is moved to j=3, the sample at i=20 is moved to j=20, and the sample at i=23 is moved to j=13.

For Table 5, the second row can be obtained by starting at zero and adding 31 (A) to the previous entry, subtracting 100 (C1) whenever the result equals or exceeds 100 (C1). For example, when 31 is added to 93, the result is 124, so 100 is subtracted and 24 is entered for the next table entry.

Figure 5A:
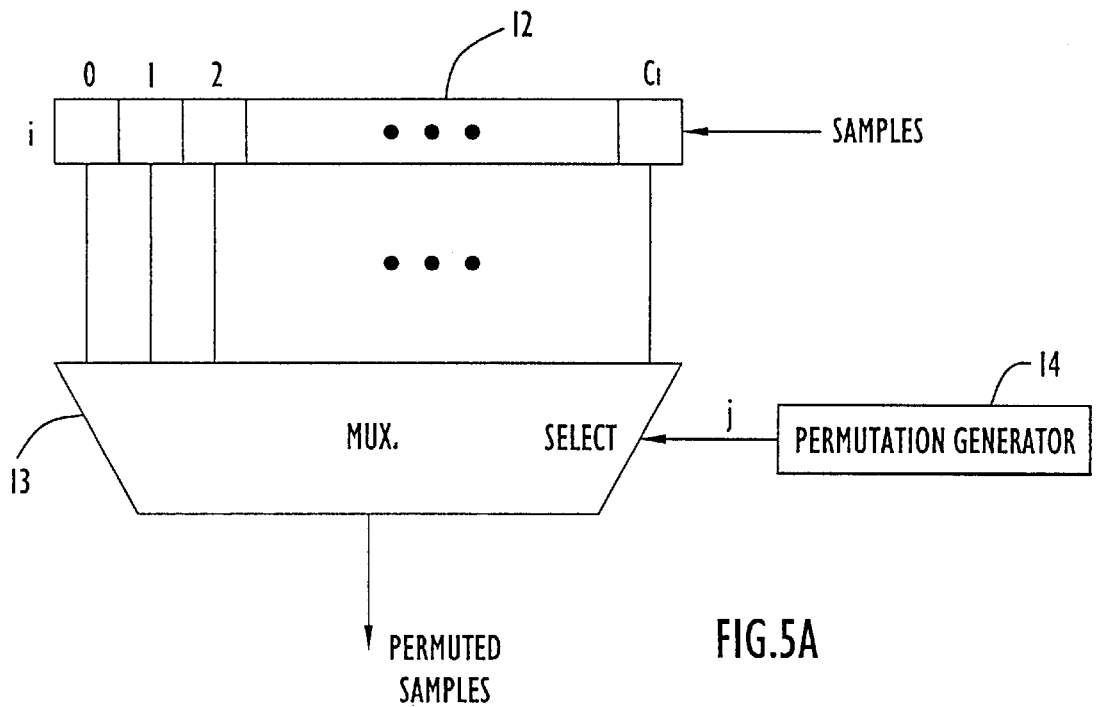
FIG. 5A is a diagram of an embodiment of a permuter according to the invention.

A permuter that performs these permutations can be constructed from a register 12, a multiplexer 13 and permutation generator 14, as shown in FIG. 5A. Samples from the sampler are transferred in to a shift register 12 that is C1 bits long. When the shift register is full (i.e., when C1 samples have been loaded), as indicated by a controlling counter, the samples stop shifting into the shift register.

Next, the samples are read from the shift register 12 in a permuted sequence. A multiplexer 13 can be used for reading the register in that manner. The multiplexer 13 is connected to the shift register 6 so that it can select any bit in the shift register. The bits of the shift register, which are the i values, are numbered as follows: 0 is the first bit shifted in (at the far end), 1 is the second bit shifted in, 2 is the third, etc. The multiplexer 13 is connected to the shift register 12 such that the binary integer i at the select input of the multiplexer 13 selects bit i. The samples are to be read in the sequence given by j, as shown in the above tables, and the select input can be connected to a permutation generator 14 that generates that j values shown in Table 5. Thus, the samples are read in the following order: i=0, then i=71, 42, 13, etc.

Figure 5B:
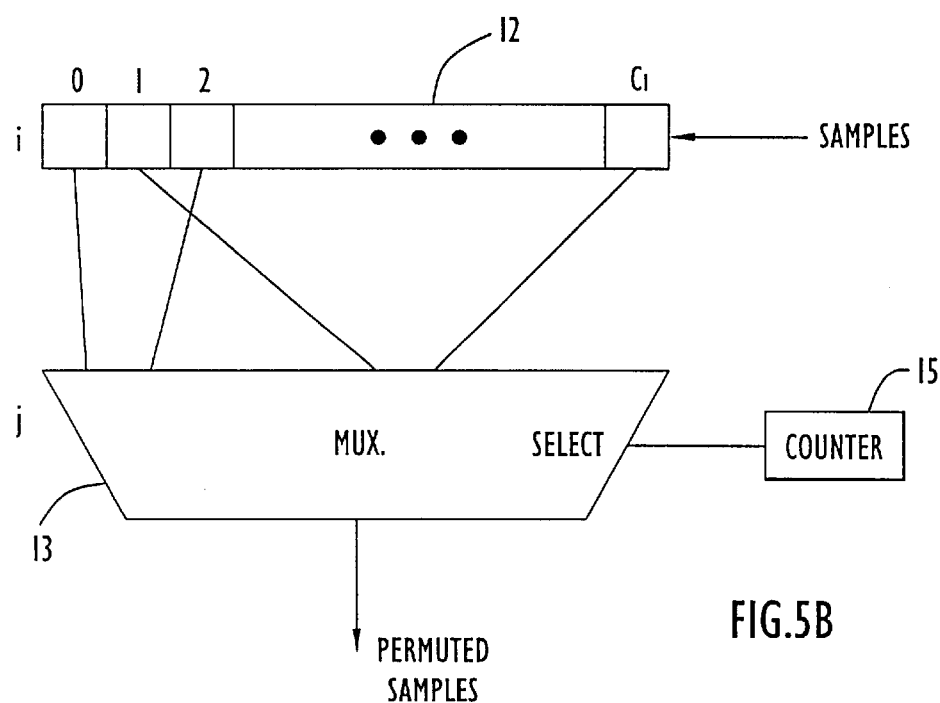
FIG. 5B is a diagram of another embodiment of a permuter according to the invention.

Alternatively, the register 12 and multiplexer 13 can be interconnected so the register position i is connected to an input j of the multiplexer, as shown in FIG. 5B. A counter 15 that counts in sequence, i.e., 0, 1, 2, 3, etc., then can be input to the multiplexer's select input. The multiplexer 13 will then output the i samples according to the sequence j shown in Table 5. In either embodiment the number of samples read must be counted, and for this purpose the earlier described controlling counter can be used.

Figure 6:
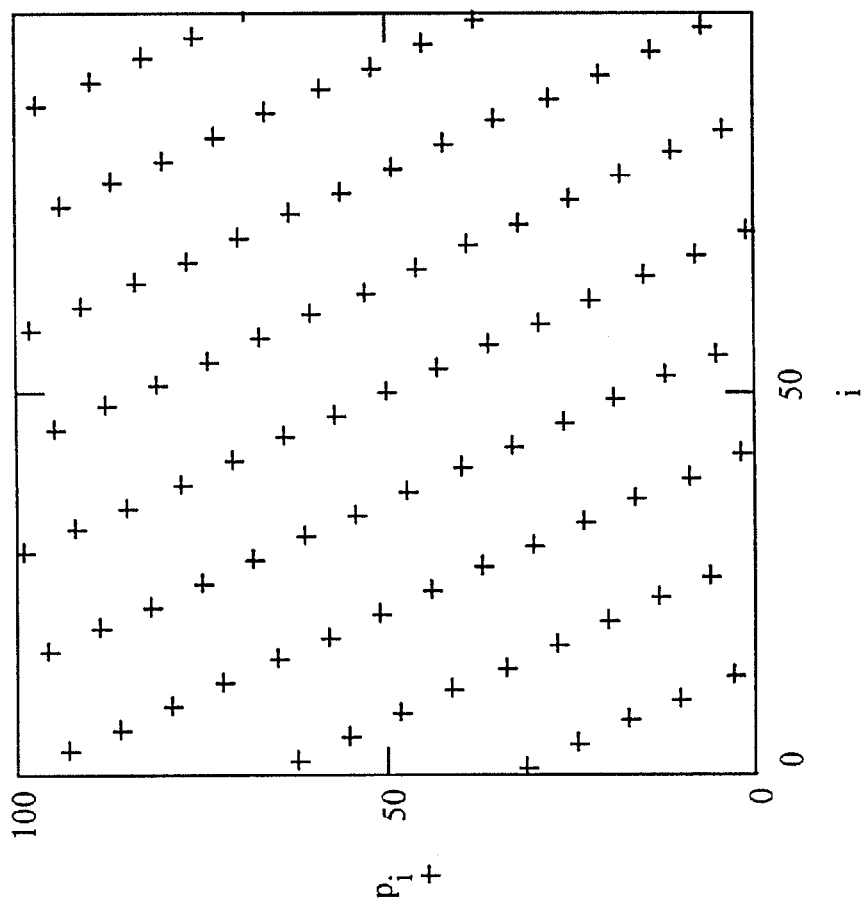
FIG. 6 is a plot showing permuted samples.

A plot of 100 permuted samples is shown in FIG. 6. These samples are permuted by moving the ith sample to the jth position, where j=31*modulo 100. In FIG. 6 the 131/100 permutation follows the formula $p_i = \mod(131*i, 100)$, which is equivalent to $p_i = \mod(31*i, 100)$. This permutation can be used for both the CAFS and the RAFS. The inverse permutation follows the formula $r_i = \mod(71*i, 100)$, because mod (31*71, 100)=1.

Matched Filter

Figure 7:
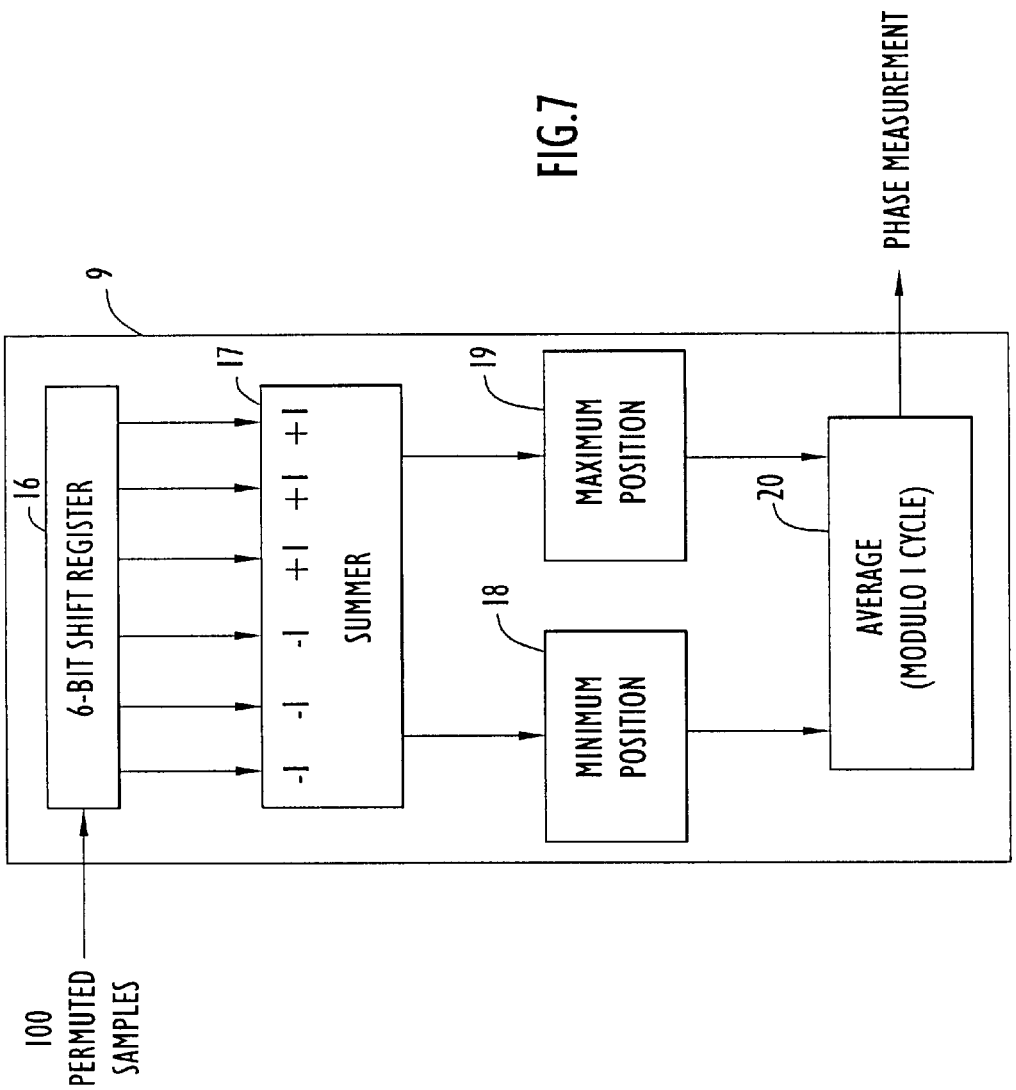
FIG. 7 is a block diagram of a matched filter.

The matched filter 9 operates to detect the sometimes-fuzzy edges of the permuted sample sequence. An embodiment of the matched filter is shown in FIG. 7. It includes a 6-stage FIR filter with weights −1,−1,−1,1,1,1. As shown in FIG. 7, the FIR filter includes a 6-bit shift register 16 receiving the permuted samples, and applies those samples to summer 17 that sums them using the weights noted above. A minimum position unit 18 and maximum position unit 19 process the output of the summer 17 to detect the minimum and maximum position outputs of the filter. The positions of the maximum and minimum outputs of the filter provide redundant phase estimates, which are actually phase measurements of the rising and falling edges of the AFS clock. An averaging unit 20 averages the minimum and maximum phase estimates to obtain a phase measurement with a resolution of 0.005 AFS cycles.

The resulting phase measurement has a small error component that is proportional to the frequency offset from the nominal 131/100 ratio. Software can use the nominal frequency ratio to correct this, if desired, but it does not effect the phase change used to compute an interval measurement.

The matched filter must be operated with modulo-100 arithmetic. First, the processing of the shift register outputs cannot be enabled until the shift register is filled with the first 6 bits of the permuted samples. After shifting and processing the remaining 94 samples, the first 6 bits need to be shifted in again, so that all 100 phase positions can be processed.

The logic to find the minimum filter response, and the logic for the maximum, are similar. Each one needs two registers: one to remember the current min (or max) value, and one for the phase position where the min (or max) was found. The value register can be initialized either to the first filter response value, or to the middle of the value range. During the processing cycle, the value and position registers are loaded with the current value and position whenever a more extreme value is found. It is optional whether such loading is also done when an equal value is found. When there is more than one min (or max), the logic will choose the last one if the option is taken, else the first one. Preferably, the min and max logic blocks should take opposite choices for this option.

The positions of the minimum and maximum filter response correspond to the phase positions of the rising and falling edges of the AFS clock. Averaging these values doubles the phase resolution, providing 200 values per cycle. The averaging also cancels the effect of noise sources that affect rising and falling AFS clock edges oppositely. The average is the sum modulo one cycle, divided by two; but using binary integer representation, we can simply redefine the scale rather than dividing by two. Using the average for the phase measurement establishes the phase reference point midway between the rising and falling edges of the AFS clock. Adding a half-cycle, before dividing by two or changing scale, changes the phase reference point to one of the AFS clock edges, provided that the AFS clock is exactly symmetrical. But when using the phase measurements for interval measurements or for frequency tracking, the absolute phase reference does not matter. Thus, it is not necessary to include hardware that would only redefine the absolute phase reference.

The effect of noise sources that affect rising and falling system clock edges oppositely can also be cancelled, by repeating the phase measurement with the system clock input inverted, then averaging these two measurements. This would also shift the absolute phase reference point and double the phase resolution again.

The difference between the minimum and maximum positions provides a measure of the duty cycle of the AFS clock, and is useful for checking the integrity of the phase meter. For example, if one of the inputs or the sampling circuit would fail, causing all samples to be equal, the duty cycle would be measured as zero.

Interval Counter

An interval counter 10 is connected to sampler 6 and also receives the samples, and thus, the same sequence of samples used to measure phase is also used to drive the counting function. This cooperation helps to resolve phase ambiguities. However, for the counting function, the sampling continues throughout each counting period. In the case of GPS, the counting period is one GPS epoch, which is 1.5 seconds long. If two successive samples differ, as detected by an exclusive-or gate, it indicates that the AFS clock had an odd number of transitions between these two samples. Otherwise there was an even number of transitions. Since the frequency ratio is between 3/2 and 1, the odd number is always 3, and the even number is always 2. Thus, if X ones are counted from the exclusive-or gate during N cycles of the system clock, then this is an indication that the AFS clock had 2*N+X transitions during these N cycles, or X transitions more than the system clock.

To end one counting interval and start another without missing any transitions, the counter is synchronously initialized while the final count is copied to an interface register. A transition near the beginning or end of the counting interval (epoch) is always included in either one counting interval or the next. No transition is ever overlooked, even though the assignment of a transition to a counting interval is sometimes arbitrary, such as when clock edges at the epoch boundary are aligned.

The nominal transition count for a 1.5 second epoch is 9,514,032 (for RAFS), requiring a 24-bit counter. But an 11-bit counter would suffice to cover a 100 ppm range of frequency variation, assuming this is needed for start-up situations. More bits, such as 16 bits, would also provide integrity checking.

Interval Measurement

Preferably the transition count and phase measurements are combined to obtain a measurement of the interval length, with the range of the count and precision of the phase. Count adjustment unit 11 performs such a combination. Here, time is measured in units of AFS cycles, with integer time values occurring at rising edges of the AFS clock. FIGS. 8A through 8D show various instances of a clock signal, with differing phases, within a count interval. Various instances of the signal are illustrated by the waveforms shown in FIGS. 8A through 8D. The phase of a signal, here, refers to the fractional part of a cycle of the waveform at the boundary between two counting intervals.

The length of a time interval is the end time minus the beginning time. Accordingly, the phase change (i.e., end phase minus beginning phase) equals the fractional part of the interval length. This suggests that the "interval count" is the integer part of the interval length. The transition count must be translated to the "interval count", then the phase change appended to this count to obtain the final interval measurement.

Ambiguity Problem

The count of transitions approximates the number of half-clock-periods. That is, the count can be divided by two and the result added to the number of periods of the system clock in the interval to estimate, with a resolution of ½ cycle, the number of periods of the AFS clock in the interval. But this result can only be an estimate, because the interval counter equals the actually counted transitions, not half-clock-periods. There is an uncertainty spanning a ½ cycle at each end of the counting interval, plus jitter and rounding error.

For example, consider where time is measured in AFS clock cycles, where the interval length is close to 3.0, and where the phase is close to zero at both ends of the interval. This example is illustrated in FIGS. 8A through 8D.

There are four combinations of count uncertainties shown, with varying transition counts, from which are derived varying estimates of the number of cycles. In the rightmost two columns of FIGS. 8A–D these four combinations are combined with two representative phase-change values close to zero (i.e., 0.99=–0.01 modulo 1.0). In each of these eight cases, the interval measurement that best fits the data are listed; that is, the number of cycles are adjusted to the nearest value that agrees with the measured phase change.

Even though an interval measurement close to 3.0 is usually changed, sometimes a measurement is close to 2.0 or 4.0. Also, if a similar diagram is made for the case where the actual interval length is close to 4.0, the transition counts would be greater by 2, and the cycle counts and interval measurements greater by 1. Thus, the first row of this new table would be the same as the last row of the above table. This demonstrates that the same data can be observed when the actual interval is close to 4.0 as when it is close to 3.0. Hence, the number of transitions does not always clearly indicate the number of cycles, thereby creating an ambiguity as to how many cycles are present in the interval.

Figure 9B:
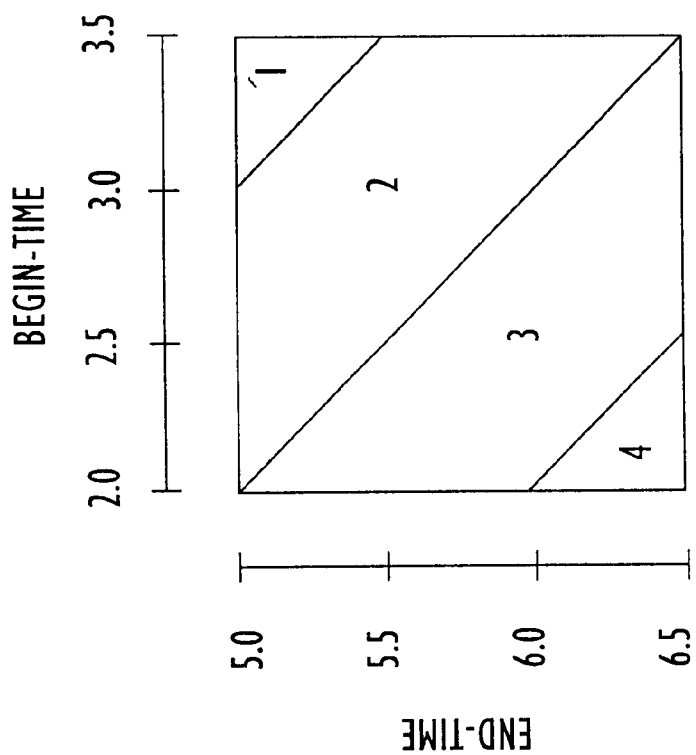
FIGS. 9A–B are interval count diagrams showing a count ambiguity over a count interval.
Figure 9A:
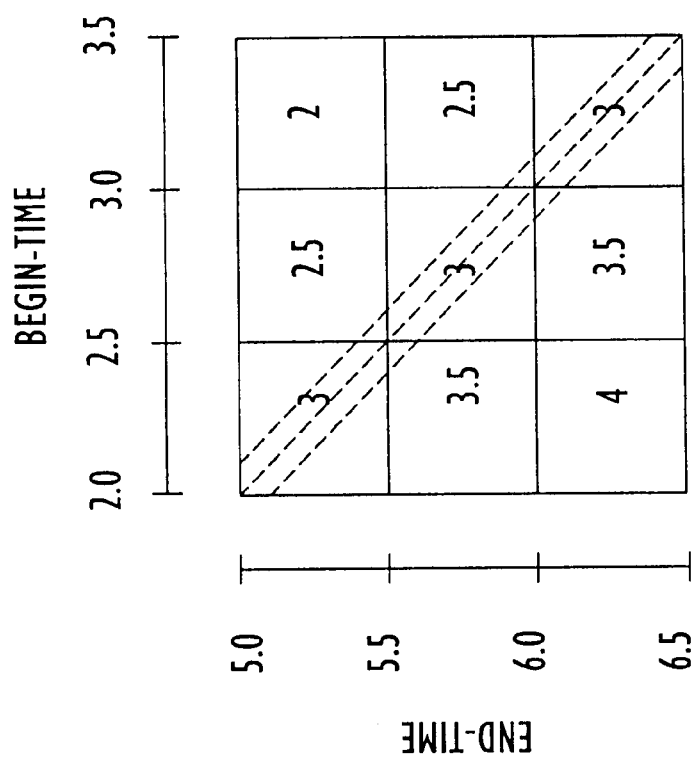

Another way to understand the ambiguity is to plot the interval count as a function of the times of the beginning and end of the interval, as shown in FIG. 9A.

The numbers in the squares in FIG. 9A indicate the number of AFS clock transitions divided by two (scaled to cycles) for various combinations of begin-time and end-time. For example, for begin-times in the range 2.0 . . . 2.5 and end-times in the range 5.0 . . . 5.5, the transition count will be 6. Also, if at end-times in the range 5.0 . . . 5.5, the begin-time changes from 2.49 to 2.51, the transition count will decrease by one, i.e. from 6 to 5. The dotted lines in FIG. 9A correspond to interval lengths of 3.0, and a little more, and a little less. At the position begin-time=2.5 and end-time=5.5, only the phase noise will determine if the result is 2.5, 3.0, or 3.5.

By contrast, FIG. 9B illustrates the interval count provided by the present invention. For example, interval lengths in the range 3.01 . . . 3.99 lie in the sloping area labeled "3". The position of the sloping lines shown in FIG. 9B depend on the measured phase change, which is derived from many samples, but the position of the grid lines in FIG. 9A depend only on the phase of the transitions at the beginning and end of the interval. Thus, the sloping lines may not pass exactly through the grid intersections.

Count Adjustment Logic

The logic described next solves the ambiguity problem by estimating the phase at the beginning and end of each counting interval. Three successive samples spanning each boundary of the intervals provide a coarse phase estimate with a resolution of about ⅙ cycle. By comparing these phase estimates, the count is adjusted so that the sum of the uncertainties at the beginning and end of the counting interval is about +/–0.38 cycle plus jitter. Ambiguity is eliminated by using the same samples used to drive the counter. Finally, the phase change measured by the phase meter (fine phase) is used to adjust the count again so that the adjusted count gives the integer part of the interval length, while the phase change gives the fractional part. The count adjustment process thus has the following three stages, described next:

(1) measure the coarse phase at the beginning and end of the interval;
(2) use the coarse phase to adjust the count; and
(3) use the fine phase to adjust the count.

Coarse Phase Measurement

Figure 10:
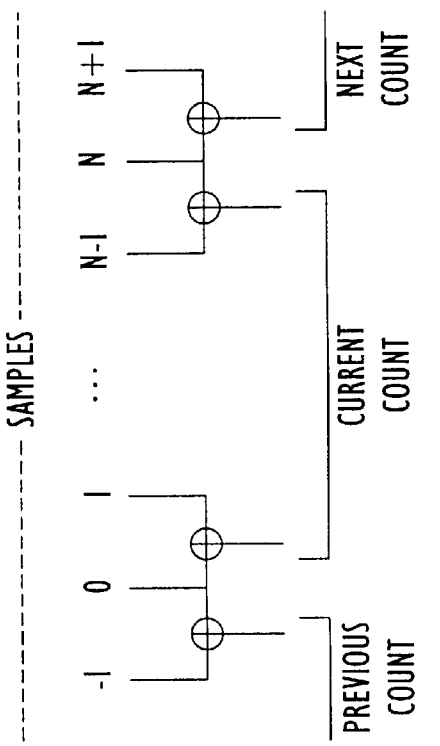
FIG. 10 is a diagram showing how samples are counted.

The course phase measurement is described with reference to FIG. 10, in which samples are exclusive-or'ed. In FIG. 10 the samples are numbered as follows: The first exclusive-or counted in the interval is the exclusive-or of samples 0 and 1, and the last exclusive-or counted in the interval is the exclusive-or of samples N−1 and N, where N is the number of samples in the current counting interval. Thus, the previous count ended with the exclusive-or of samples −1 and 0, and the next count will start with the exclusive-or of samples N and N+1. If a transition is moved across the boundary between the previous and current count intervals, it changes sample 0, which changes the previous and current counts in opposite directions. The same applies to the boundary between the current and next count intervals, at sample N.

Figure 11:
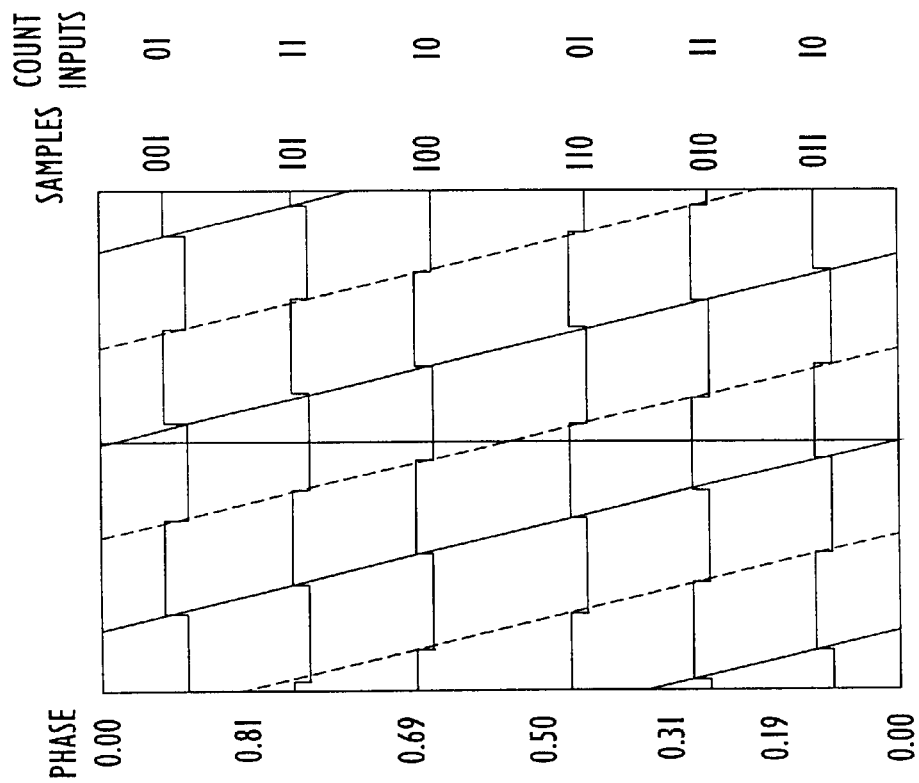
FIG. 11 his a waveform diagram showing various phase offsets of a signal and the counts for those offsets.

FIG. 11 illustrates the situation at each boundary, and shows time horizontally for two periods of the system clock, and shows phase vertically for one cycle. The three vertical lines represent three successive edges of the system clock that sample the AFS clock, and correspond to samples −1, 0, and 1 (plus a multiple of N for other boundaries). The middle vertical line represents the boundary between two counting intervals. The slanting lines represent the rising and falling edges of the AFS clock.

Since the six sample sequences shown on the right side of FIG. 11 are distinct, and since the six ranges are fairly uniform, this diagram demonstrates that three consecutive samples can be used to measure the phase to about ⅙ cycle resolution. The three sample bits can be used as a phase code spanning one cycle with ⅙ cycle resolution, or the two count-input bits can be used as a phase code spanning ½ cycle with ⅙ cycle resolution.

First Count Adjustment

Figures 12A, 12B, 12C, 12D:
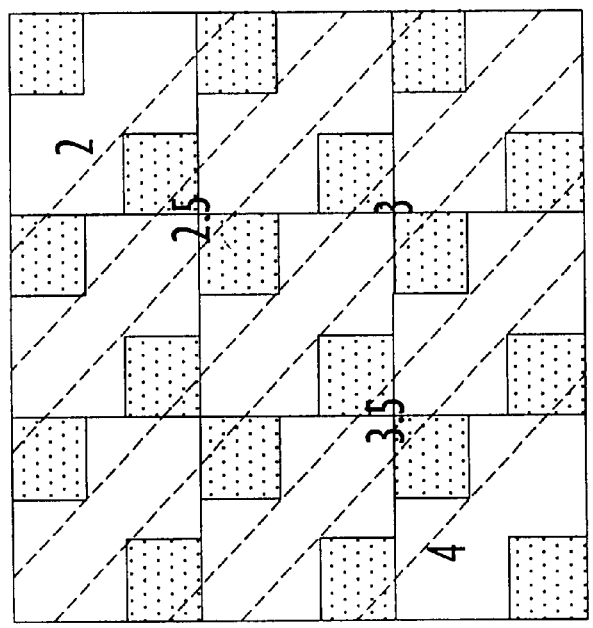
FIGS. 12A–D are interval count diagrams relating to coarsely adjusted interval counts.

The two-bit coarse phase codes are used to adjust the interval count as shown in FIG. 12A. First, for reference, FIG. 12A is a simplified version of FIG. 9A. Again, phase is considered the fractional part of time when measuring the time of interval boundaries (selected system clock edges) using the AFS clock edges as the "time ruler". The coarse phase codes provide more time resolution and can be used to improve the interval measurements represented by FIG. 12A.

For example, FIG. 12B shows how each square of FIG. 12A can be sub-divided. Each column of FIG. 12B corresponds to one of the phase code values for the beginning of the interval, and each row of FIG. 12B corresponds to one of the phase code values for the end of the interval. The values shown in FIG. 12B represent adjustments that can be applied to each square of FIG. 12A to improve its resolution. For example, if the square of FIG. 12B is conceptually placed on top of one of the "2.5" squares of FIG. 12A, and the adjustment values are added to the 2.5 value, values are obtained ranging from 2 ⅙ to 2 ⅚ in the various subregions.

FIG. 12C shows a simpler method, where the adjustments are rounded off to the nearest multiple of ½. Thus, +⅙ and −⅙ round off to 0, and +⅓ and −⅓ round off to +½ and −½, respectively. Because the values of FIG. 12A are also multiples of ½, no new values are created by applying these adjustments. For example, the bottom left corner of the "2" square is adjusted to 2.5, and the top right corners of the "3" squares are also adjusted to 2.5. The result is that the "2.5" regions of FIG. 12A are merged into one well-connected region, as shown in FIG. 12D, where the adjusted regions are shown by shading. The same process is performed for all of the regions.

Unlike in FIG. 12A, there is no position in FIG. 12D where regions "2.5" and "3.5" (for example) are close, so that a little jitter can change the result by an entire cycle. In FIG. 12A the actual interval lengths included in region(s) "3" range from 2.5 to 3.5, showing that the count before adjustment estimates the interval length with errors ranging from −0.5 to +0.5. However, in FIG. 12D the actual interval lengths included in region "3" range from 2.62 to 3.38, showing that the count after adjustment estimates the interval length with errors ranging from −0.38 to +0.38.

Second Count Adjustment

Figure 13B:
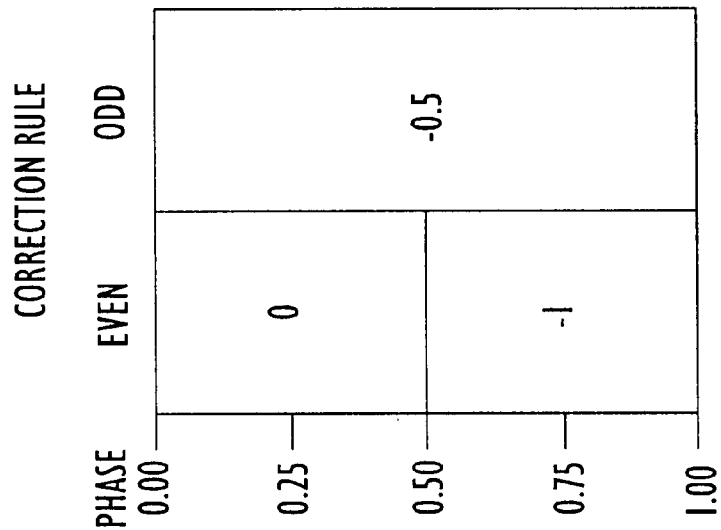
FIGS. 13A and B are interval count diagrams relating to finely adjusted interval counts.
Figure 13A:
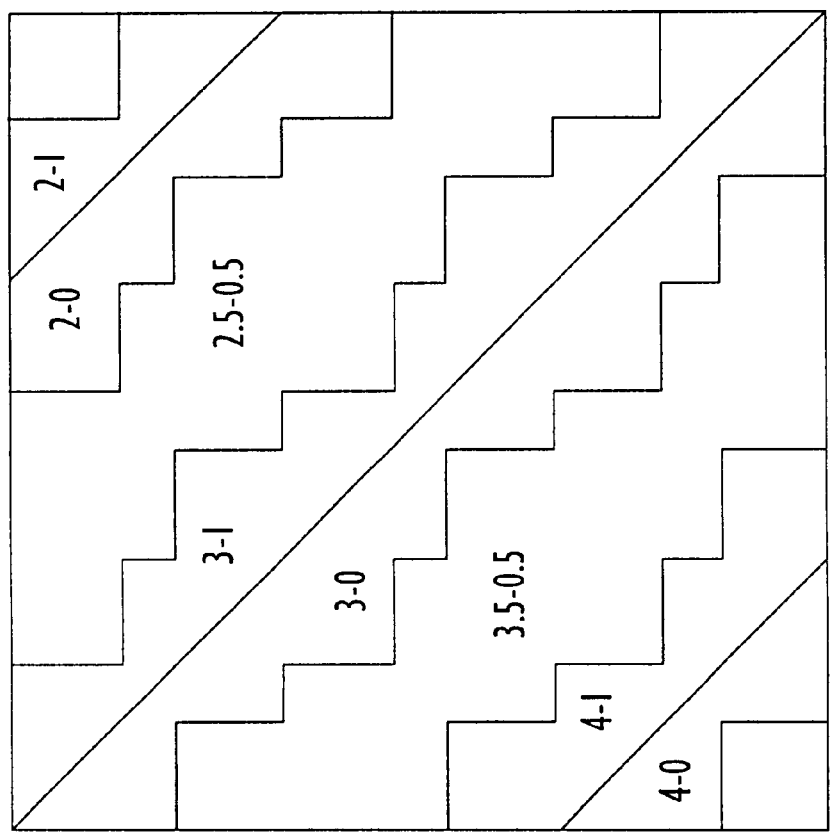

FIGS. 13A and 13B show how to convert from the adjusted transition count shown (scaled to cycles) in FIG. 12D to the "interval count" as shown in FIG. 9B.

The labels of the regions shown in FIG. 13A have the form X−Y, where X is the interval measurement adjusted according to FIG. 12D, and −Y is a second adjustment defined in FIG. 13B. This final adjustment depends on the fine phase change measurement and whether the transition count is even (NNN.0 after scaling) or odd (NNN.5 after scaling). It is easily verified that X minus Y always results in the "interval count" shown in FIG. 9B. The phase change measurement can be added to this count to obtain the final interval measurement. The sloping lines, which depend on the fine phase measurement, do not pass through, or even near any of the grid lines (horizontal and vertical lines), which depend on the transition count and coarse phase codes. This allows for discrepancies between the fine and coarse phase data.

Sample, Permute and Detect with Bin Counters

Figure 14:
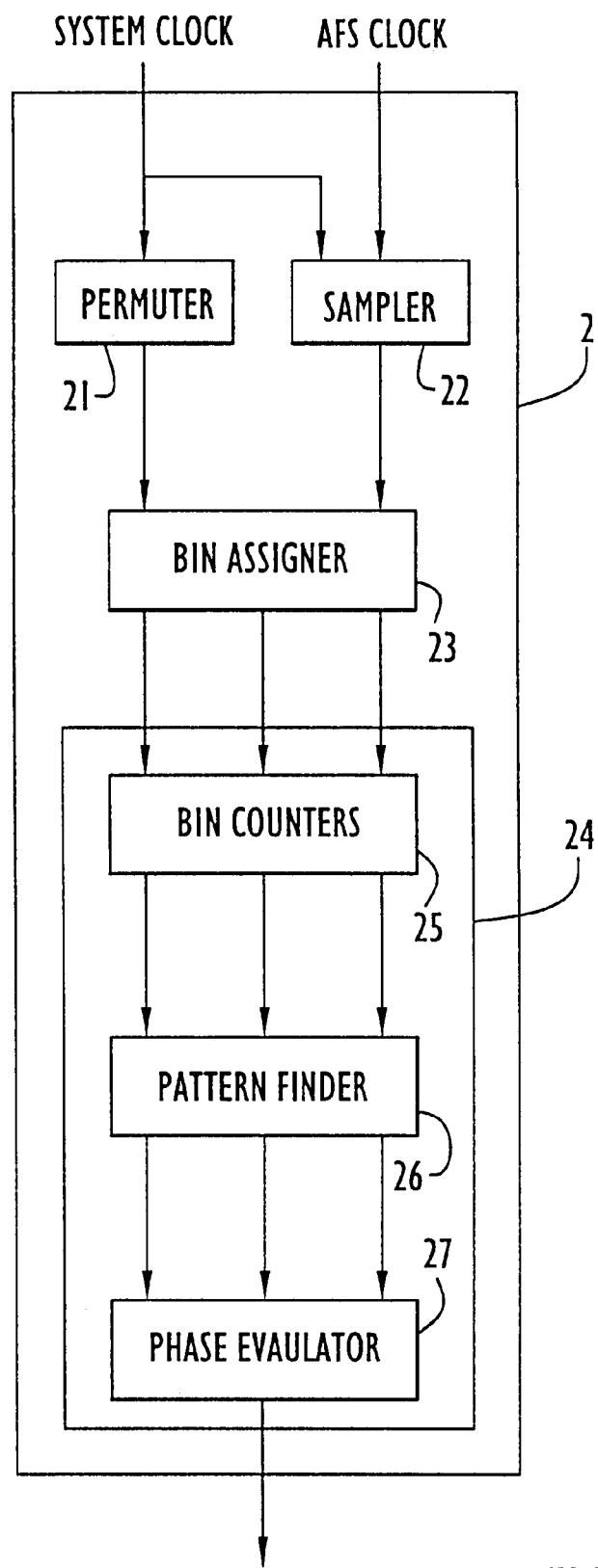
FIG. 14 is a block diagram of a phase meter according to a second embodiment of the invention.

Another embodiment of the phase meter according to the invention is shown in FIG. 14. That embodiment, like the phase meter described above, samples the faster clock with the slower clock and permutes the samples. However, it does not store the all the samples in a cycle before permuting them and process the samples with a matched filter. Rather, it uses a bin count to sort the permuted samples as they are generated, and evaluates the samples based on a formula determined by the bin count to determine the phase.

The phase meter according to this embodiment generally reduces the hardware cost while requiring a longer measurement time (more phase samples), compared to the phase meter discussed above that uses a permuter and matched filter. As with the phase meter using a permuter and matched filter, this phase meter also begins with a sampler in which the system clock samples the AFS clock. It also includes a permuter 21 that converts the sample time sequence to a relative phase sequence. However, the present phase meter uses the permuter differently than the phase meter described above, and it does not use a matched filter.

In the phase meter described in the first embodiment, the permuter is used to permute the samples so that, having been collected in time sequence, they can be stored in relative phase sequence for subsequent processing. With the present phase meter, the samples are not stored, and therefore the number of samples can be increased without incurring a proportional increase of the hardware cost. Instead, the cost is proportional to the logarithm of the number of samples per measurement period.

The phase meter shown in FIG. 14 includes a bin assigner 23 that receives the samples and permuted sample positions and assigns the samples to a "bin". A bin processor 24 includes bin counters 25 that count the samples placed in each bin, a pattern finder 26 that detects patterns based on the number of samples placed in the bins, and a phase evaluator 27 that evaluates the samples according to a formula selected based on the sample pattern detected by the pattern finder 26.

Figure 15:
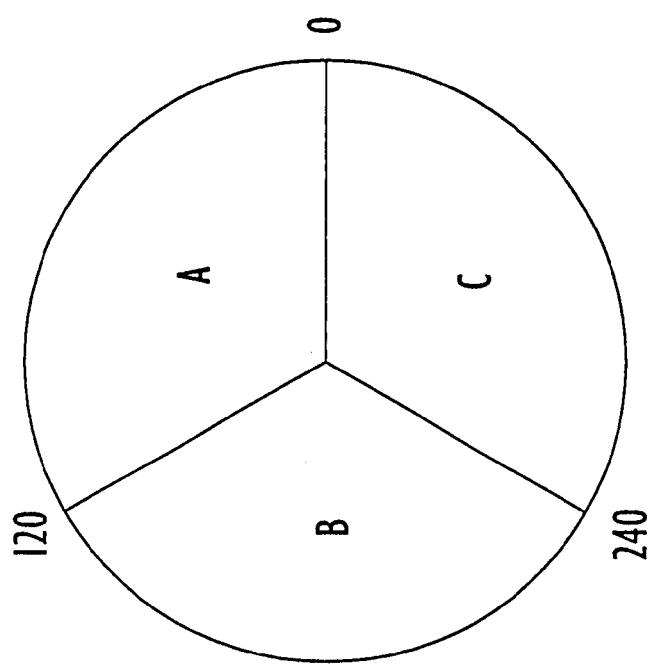
FIG. 15 is a conceptual diagram of three phase bins used in the invention.

In the present phase meter, the permuter operates to compute the phase positions of the samples so that those phase positions can be sorted into B 'bins' or phase categories, and so that the number of samples with a value of "1" falling within each bin's phase range can be counted. The bins are shown conceptually in FIG. 15 by dividing all possible phases into B equal and contiguous regions. The hardware cost is minimized by choosing B=3; and hereafter B will be treated as equaling three (3). For example, as shown in FIG. 15, the phase meter assigns samples with phases within the range from 0 to 120 to bin A (labeled "A" in FIG. 15), samples with phases within the range from 120 to 240 degrees to bin B (labeled "B" in FIG. 15), and samples with phases within the range from 240 to 360 degrees assigned to bin C (labeled "C" in FIG. 15).

In any one measurement period, the phase positions of the samples will be nearly uniformly scattered (in a random sequence) throughout the entire range of phases, i.e., 360 degrees. The uniformity is optimized by the choice of the permuter parameters and the number of samples taken in each measurement period. The samples with value 1 will fall within one region spanning 180 degrees, and the samples with value 0 will fall within the remaining region, also spanning 180 degrees, as shown for a typical case in FIG. 16. The underlying idea of the present phase meter is to measure the phase by determining how the 1-value and 0-value samples are distributed among the bins.

Figure 16:
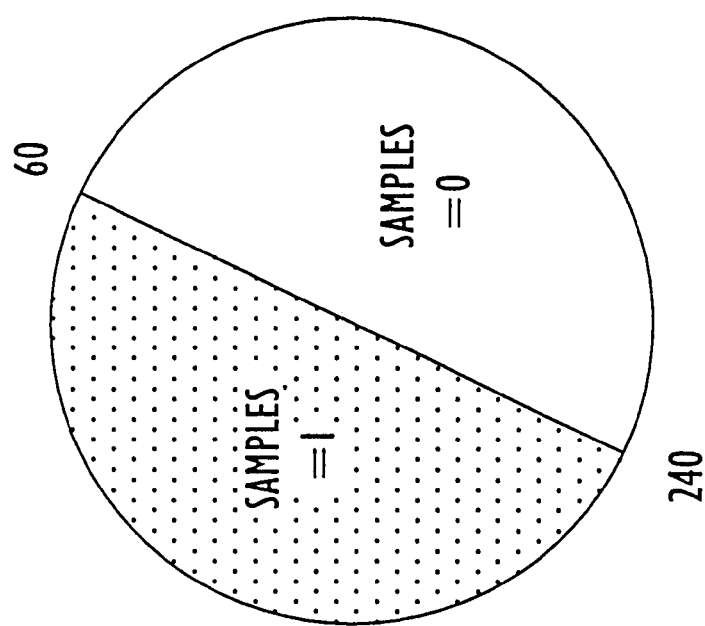
FIG. 16 is a conceptual diagram illustrating a conventional phase measurement.

The clockwise 0-to-1 boundary position, or alternatively, the clockwise 1-to-0 boundary position minus 180 degrees, illustrated in FIG. 16, defines the phase value. In practice, these boundaries may be fuzzy due to jitter and due to the actual frequency ratio differing from the nominal frequency ratio C2/C1. Thus, the measurement accuracy can be improved by averaging the positions of both boundaries.

For the example phase boundary shown in FIG. 16, 50% of bin A contains 1-value samples, 100% of bin B contains 1-value samples, and 0% of bin C contains 1-value samples. If the phase is increased by 60 degrees, thereby rotating the phase boundary shown in FIG. 16 counterclockwise 60 degrees, then the percentage of bin A that contains 1-value samples decreases by 50%, and increases by 50% for bin C, but the percentage for bin B does not change. Therefore, for this 60-degree span, the phase value is proportional to C-A, where C and A refer to the percentage of bins C and A that contain 1-value samples, respectively. However, if the phase is increased further, the percentage for B decreases instead of A, so that the phase for the next 60 degrees is proportional to C-B. Hence, for each 60-degree span, there is a different pattern of proportionality, and the percentage of 1-value samples in the bins indicates a formula to apply to determine the phase.

The arrangement shown in FIG. 17 applies the principles just described. Each row corresponds to a phase position where one of the zero-one boundaries coincides with one of the bin boundaries. The numbers in the first three columns are the percentage of 1-value samples in each of the bins (i.e., bins A, B and C). Alternatively, these would be the actual sample counts if the total number of samples were 300, or 100 per bin. The fourth column gives the phase values, using a convenient scale: 600 corresponds to 360 degrees. The rightmost column gives phase formulas (using the "convenient scale") that apply for the range of phases between two rows of the other columns. For example, the first formula applies when C=0, the second formula when B=100, etc.

Table 7 below, derived from FIG. 17, shows the percentages of the bin counts that indicate which formula applies. FIG. 17 and Table 7 do not account for the possibility that a fuzzy one-zero boundary may lie on both sides of a bin boundary.

TABLE 7

Phase Computation

| A | B | C | phase | formula |
|---|---|---|---|---|
|   |   | 0 | 0 . . . 100 | B − A + 50 |
|   | 100 |   | 100 . . . 200 | C − A + 150 |
| 0 |   |   | 200 . . . 300 | C − B + 250 |
|   |   | 100 | 300 . . . 400 | A − B + 350 |
|   | 0 |   | 400 . . . 500 | A − C + 450 |
| 100 |   |   | 500 . . . 600 | B − C + 550 |

Table 8 below accounts for the case where the one-zero boundary is not a sharp boundary. Alternate rows of Table 8 have the same data as in Table 7, and correspond to 60-degree spans. The new rows in Table 8 account for the fuzzy boundary cases, and correspond to phases near the values listed in the fourth column. "Max" refers to counts close to 100%, and "min" refers to counts close to 0%. The value "50" is a nominal value, where the actual value is close to 50%.

Each of the new formulae actually cover a range of 60 degrees, from −50 to +50 on the convenience scale relative to the value given in the fourth column. Thus the old formulae can be discarded and the process will still handle all possible phases.

TABLE 8

Phase Computation

| A | B | C | phase | formula |
|---|---|---|---|---|
| Max | 50 | min | 0 | B − A − C + 50 |
|   |   | 0 | 0 . . . 100 | B − A + 50 |
| 50 | Max | min | 100 | C + B − A + 50 |
|   | 100 |   | 100 . . . 200 | C − A + 150 |
| min | Max | 50 | 200 | C − B − A + 250 |
| 0 |   |   | 200 . . . 300 | C − B + 250 |
| min | 50 | Max | 300 | A + C − B + 250 |
|   |   | 100 | 300 . . . 400 | A − B + 350 |
| 50 | min | Max | 400 | A − B − C + 450 |
|   | 0 |   | 400 . . . 500 | A − C + 450 |
| Max | min | 50 | 500 | A + B − C + 450 |
| 100 |   |   | 500 . . . 600 | B − C + 550 |
| Max | 50 | min | 600 | B − A − C + 650 |

Table 9 below, is a simplified version of Table 8 with the old formulae discarded, where the min-max positions of the first three columns indicate the phase range, and hence, indicate which phase formula applies. The first and last row, with the same min-max positions, split a 60-degree range that straddles the 0 (360) degree position.

TABLE 9

Phase Computation

| A | B | C | phase | formula |
|---|---|---|---|---|
| Max |  | min | 0 ... 50 | B – A – C + 50 |
|  | Max | min | 50 ... 150 | C + B – A + 50 |
| min | Max |  | 150 ... 250 | C – B – A + 250 |
| min |  | Max | 250 ... 350 | A + C – B + 250 |
|  | min | Max | 350 ... 450 | A – B – C + 450 |
| Max | min |  | 450 ... 550 | A + B – C + 450 |
| Max |  | min | 550 ... 600 | B – A – C + 650 |

Table 10 reveals the regular structure of Table 9 by substituting new variables x, y, and z for variables A, B, and C. For example, A=x in the first row, A=–y in the second row, etc. The new variables defined by the first three rows are substituted in the formulae, as shown in the last row.

Here in Table 10 the pattern of substitutions is very regular. The substitutions for any row can be obtained from those of the previous row by negating all new variables and rotating them to the left. Also, the variable x is always max (equivalent to –x being min), and the variable z is always min (equivalent to –z being max). The part of the new formulae involving variables is constant (is always equal to y–x–z), and the part of the new formulae involving constants varies in a simple way: it increases by 200 after every two rows. These regularities will be used later to simplify the hardware used to detect the pattern of the counter data and to select the appropriate formula.

TABLE 10

Phase Computation

| A | B | C | phase | Formula |
|---|---|---|---|---|
| Max | y | Min | 0 ... 50 | B – A – C + 50 |
| x | z |  |  | y – x – z + 50 |
| –y | Max | Min | 50 ... 150 | C + B – A + 50 |
| –z | –x |  |  | –x – z + y + 50 |
| Min | Max | y | 150 ... 250 | C – B – A + 250 |
| z | x |  |  | y – x – z + 250 |
| min | –y | Max | 250 ... 350 | A + C – B + 250 |
| –x | –z |  |  | –x – z + y + 250 |
| y | min | Max | 350 ... 450 | A – B – C + 450 |
| z | x |  |  | y – z – x + 450 |
| Max | min | –y | 450 ... 550 | A + B – C + 450 |
| –z | –x |  |  | –z – x + y + 450 |
| Max | y | Min | 550 ... 600 | B – A – C + 650 |
| x | z |  |  | y – x – z + 650 |

In the phase meter shown in block diagram form in FIG. 14, the functions shown will be understood to be implemented in either hardware, software or firmware according to the application needs. Referring to FIG. 14, preceding each measurement period, the permuter 21 and bin counters 25 are reset. During the measurement period, the permuter 21 permutes the sample time sequence to produce the sample phase values. The sampler 22 samples the AFS clock with the system clock. One phase value and one sample value are produced for each system clock cycle. The bin assigner 23 compares each phase value to the bin boundaries, and based on that comparison assigns the sample to one of the bins. The bin assigner 23 increments the assigned bin counter 25 if the sample value is one. Following the measurement period, the pattern finder 26 scans the bin counts to determine which formula, shown in the above tables, should be selected to evaluate the phase. The phase evaluator 27 then computes the selected formula. Not shown is a counter to count the number of samples per measurement period and to control the timing of functions that precede and follow the measurement period. The components shown in FIG. 14 are described in further detail below.

Figure 18:
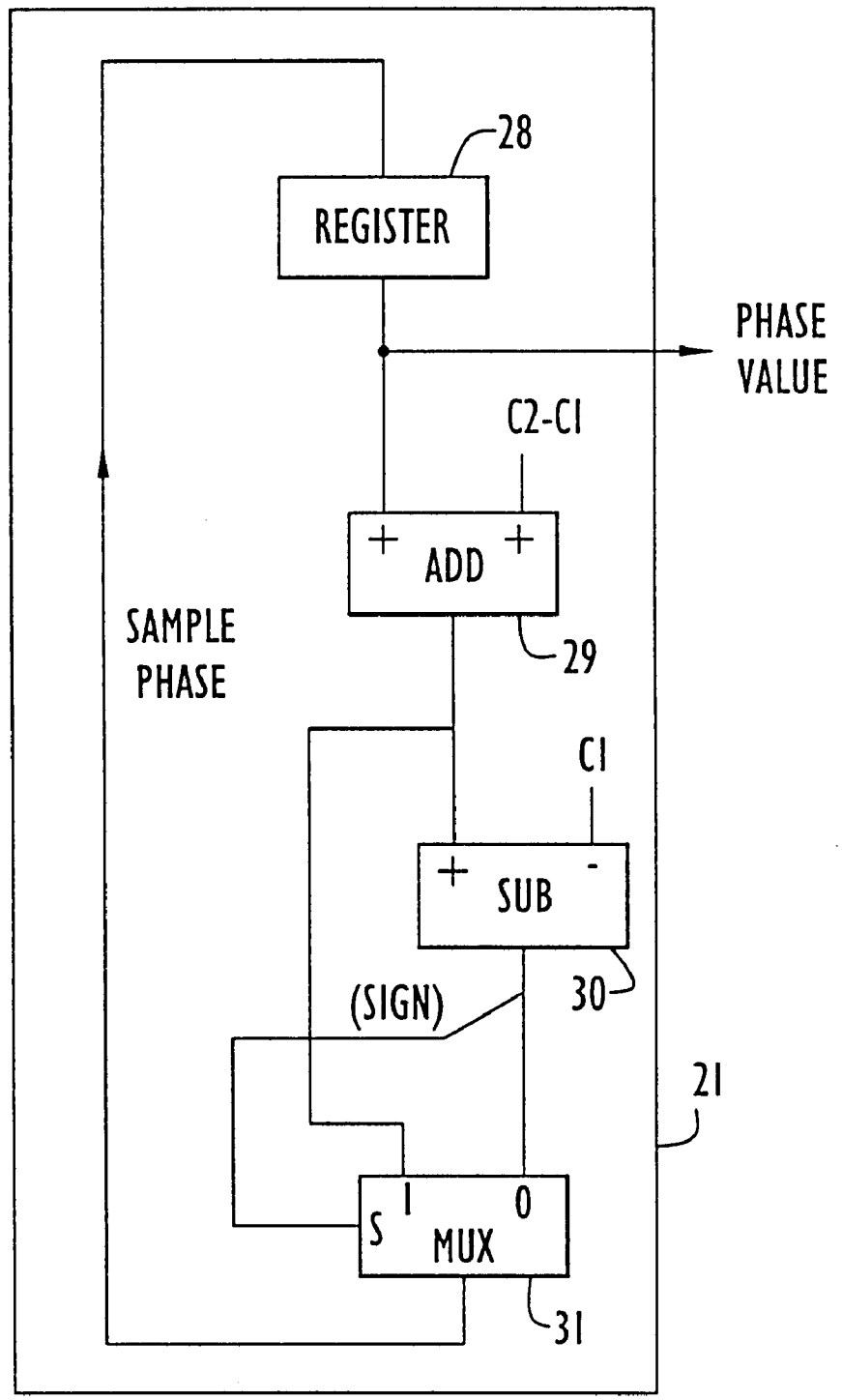
FIG. 18 is a block diagram of the permuter shown in FIG. 14.

An embodiment of the permuter 21 is shown in FIG. 18. It uses the frequency ratio parameters C1 and C2 as does the phase meter discussed above that uses a matched filter. Here, the register 28, for storing sample phases, is set to zero at the start of each measurement period, and during the measurement is clocked once per sample, that is, once per system clock. For each clock cycle, the sample phase is incremented by C2, modulo C1 (or preferably C2-C1 modulo C1, e.g. 31 modulo 100). An adder 29 adds C2 (or preferably C2-C1) to the register value, and the subtractor 30 and multiplexer 31 perform the modulo function. The multiplexer 31 is controlled by the sign bit of the subtractor output, selecting the subtractor output when it is zero or positive, else selecting the adder output.

Figure 19:
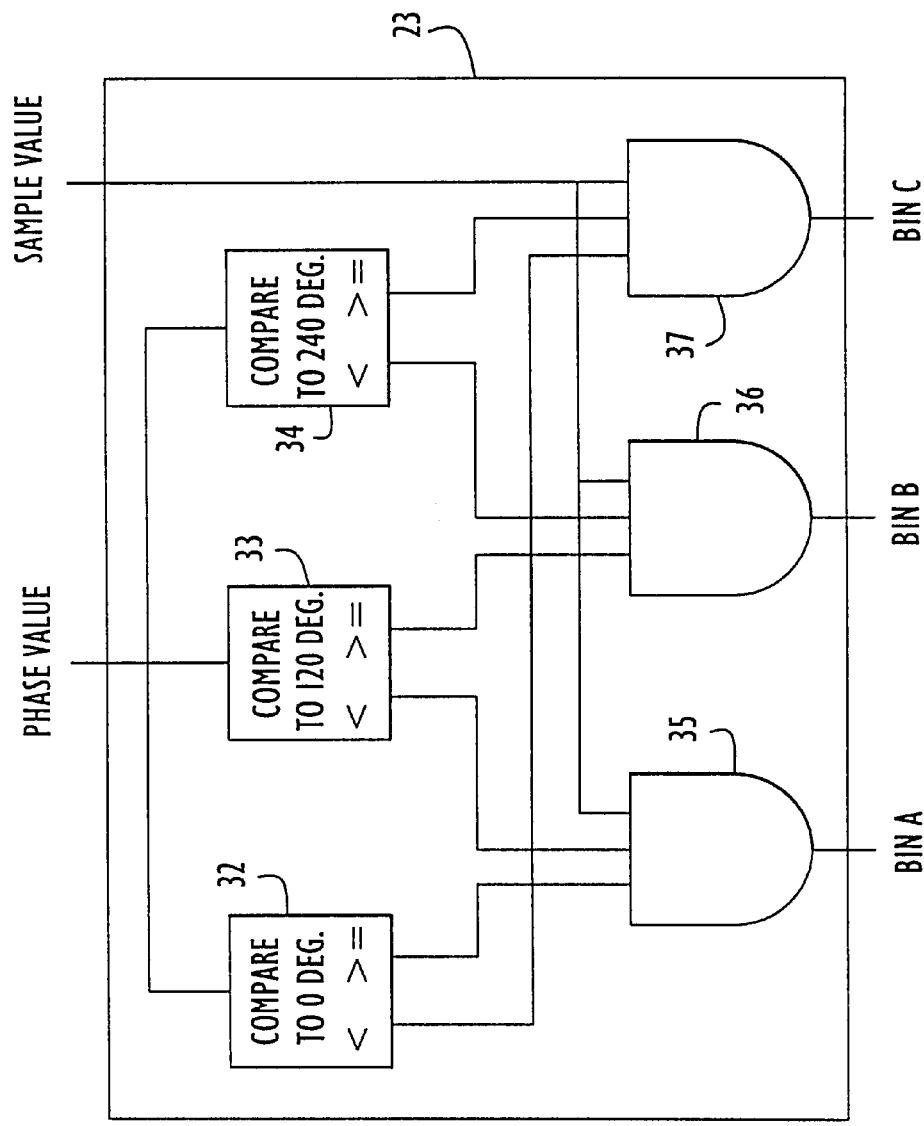
FIG. 19 is a logic diagram of the bin assigner shown in FIG. 14.

An embodiment of the bin assigner 23 is shown in FIG. 19. It includes comparators 32, 33 and 34 to compare the phase position of each sample to the bin range limits. The bin assigner also includes AND-gates 35, 36 and 37 that receive the outputs of the comparators 32–34 and associate a pair of limits with each bin. Using AND-gates 35–37 enables counting only when the sample value is one. For example, a sample is assigned to bin B by outputting a "1" from the bin B output of the bin assigner 23 only when the phase value is >=120 degrees and <240 degrees and the sample value is one.

Figure 20:
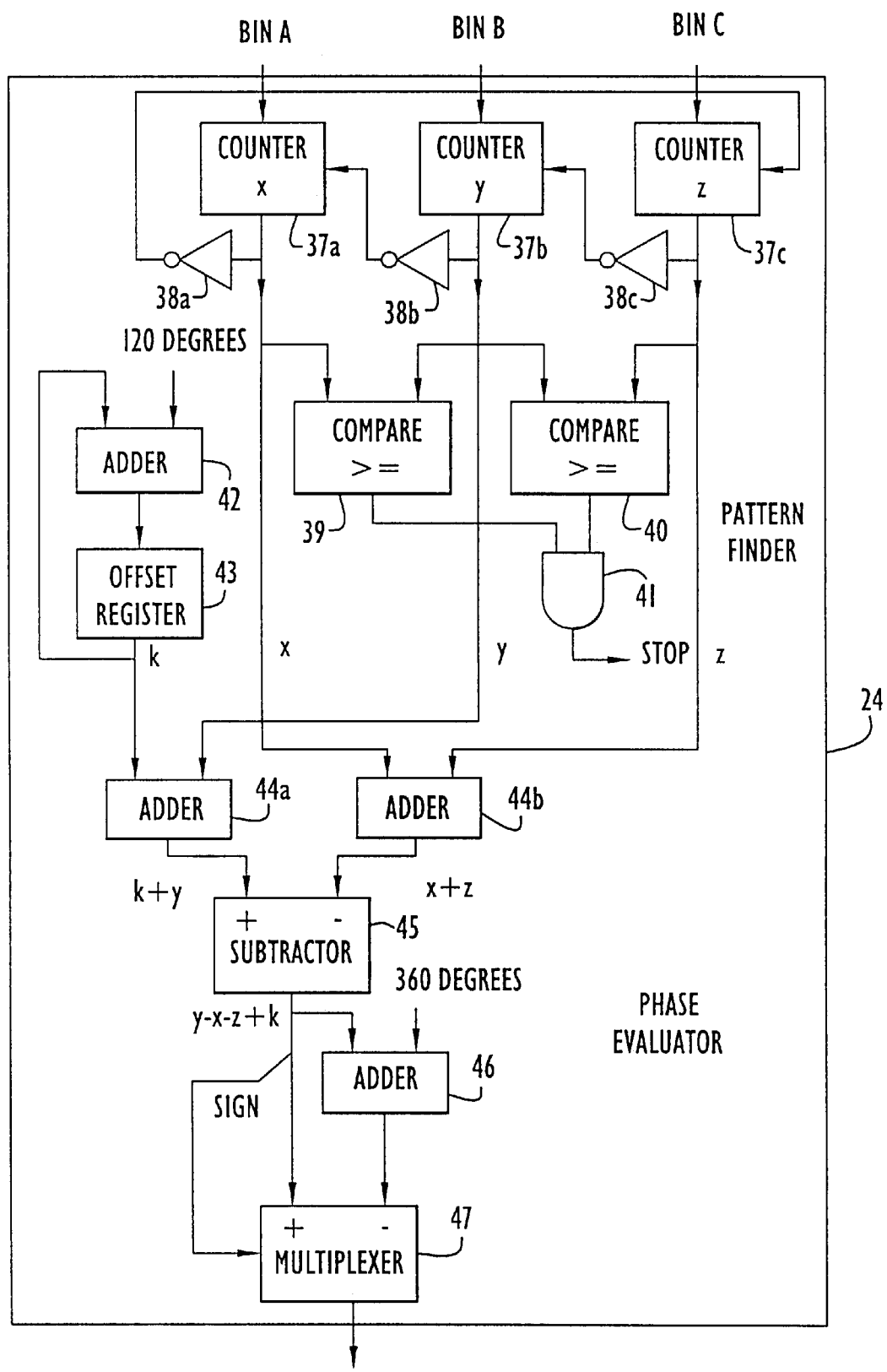
FIG. 20 is a is a block diagram showing the bin counters, pattern finder and phase evaluator shown in FIG. 14, according to the second embodiment of the invention.

The bin counters 25 are shown in detail in FIG. 20. Bin counter A includes a counter x (37a) and inverter 38a, bin counter B includes a counter y (37b) and inverter 38b, and bin counter C includes a counter z (37c) and inverter 38c. The counters 37a–c are set to zero at the start of each measurement period, and thereafter each one is incremented by an individual signal from the bin assigner. At the end of the measurement period, the counter x (37a) has the total count for bin A (x=A), counter y (37b) has the total count for bin B (y=B), and counter y (37c) has the total count for bin C (z=C).

Referring to FIGS. 14 and 20, before starting another measurement period, the pattern finder 26 must be cycled so that the appropriate phase evaluation formula can be applied to the count data. The bin counters 25 contribute to the pattern-finding process by rotating and inverting the counts as indicated by the horizontal data paths and inverters 38a through 38c. At each rotation, –y is shifted to x, –z to y, and –x to z. This process creates the sequence of x, y, z assignments listed in Table 4.

The pattern finder, also shown in FIG. 20, includes an adder 42 and offset register 43 to generate the sequence of offset values (k). The offset register 43 is initially set to 30 degrees (that is, the offset register is set to the equivalent value for whatever convenient scale is chosen). On every second rotation of the bin counters, the offset register 43 is incremented by 120 degrees, using the adder 42. This process generates the sequence of constants used in the formulae shown in Table 10.

The comparators 39 and 40 and AND-gate 41 of the pattern finder 26 check for the condition:

(x>=y) AND (y>=x), and generates the Stop signal when this condition is true. The Stop signal is used to stop the rotation of the bin counters and to enable the phase evaluator 27. The controls for processing the Stop signal are not shown. The Stop condition means that x is the maximum count and that z is the minimum count. This condition includes the x=y and y=z cases to ensure that the pattern-finding process will eventually stop. The pattern-finding process will stop in six rotations or less.

In an alternative embodiment, the inverters 38a through 38c can provide a one's-complement inverse, which is slightly offset from the two's-complement inverse (negation) used by most binary logic. The theory of operation says that certain data should be negated (two's-complement). When negating data using the two's-complement method, all the bits are inverted (i.e., one's-complement), then a one (1) is added. In the rotate logic at the top of FIG. 20, all bits are inverted, but the figure does not show adding the one in the data paths from z to y, y to x, and x to z. If the inverters 38a through 38c do not add a one to complete the two's-complement negation, the circuit will 'owe' the one that is not yet added in these cases. Adding a sign bit to the counters will allow keeping track of how many times a count was inverted, that is, whether the count is positive or negative. If negative, a one is still 'owed' (i.e., it still needs to be added). The 'debt is paid' (a one is added) when the data flows to comparators 39 and 40 or to adder 42, where the cost of doing so is almost nothing. However, adding the one in the rotate logic would cost three adders, but postponing the add-one function costs only minor changes to the compare and adder circuits.

The phase evaluator is also shown in FIG. 20, and includes adders 44a and 44b, subtractor 45, adder 46 and multiplexer 47. This arithmetic circuit evaluates the formula y−x−z+k modulo 360 degrees, which is valid when the Stop condition is true. The modulo function is needed to accommodate the first and last rows of Table 4, which share the same pattern in the first three columns, but not the same total offset. The modulo function is implemented by the final adder 46 and multiplexer 47, using the sign bit of the subtractor 45. If the subtractor's result is negative, 360 degrees are added to the result. This result is valid after the Stop signal is true, allowing time for the arithmetic circuit delays, and until the next measurement period is started. The multiplexer 47 then outputs the phase measurement value.

Having described preferred embodiments of a phase meter using a permuter and a bin counter, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in their ordinary and accustomed manner only, unless expressly defined differently herein, and not for purposes of limitation.

What is claimed is:

1. A method of measuring a phase of a first signal with respect to a second signal, comprising:

sampling the first signal with the second signal to produce a plurality of samples, each sample having a sample value and a sample phase;

permuting the plurality of sample phases;

determining, for each permuted sample phase, if the sample phase is within a phase range from among a plurality of phase ranges;

counting, for each of the plurality of phase ranges, a number of sample phases determined to be within the phase range; and determining a phase of the first signal based on the number of sample phases counted within each phase range.

2. The method of claim 1, wherein the first signal has a frequency F1 and the second signal has a frequency F2 and the plurality of sample phases i is permuted according to j=A*i modulo C1, where j is the permuted sample phase, C1 and C2 are integers and C2/C1 approximates F1/F2, and A=C2 modulo C1.

3. The method of claim 1, wherein the plurality of phase ranges equals three, where A, B and C each equal a percentage of samples in one of the three phase ranges and having the same sample value, and where the phase of the first signal is determined to be proportional to C-B-A if B is substantially 100% and C is substantially 50%.

4. The method of claim 1, wherein the first signal is a frequency standard signal and the second signal is a system clock signal.

5. The method of claim 4, wherein the frequency standard signal is generated by an atomic clock.

6. A phase meter for measuring a phase of a first signal with respect to a second signal, comprising:

a sampler receiving the first and second signals, and sampling the first signal based on the second signal;

a permuter receiving the second signal and permuting phase positions of the second signal;

a bin assigner connected to the permuter and sampler, comparing a phase value received from the permuter with a plurality of phase ranges corresponding to phase bins, and selecting a phase bin based on the phase value and the phase ranges of the phase bins, and outputting a bin signal indicating the determined bin;

a plurality of bin counters each corresponding to one of said phase ranges, and each counting in response to the bin signal if the bin signal indicates the respective bin;

a pattern finder coupled to the plurality of bin counters and determining a phase evaluation formula based on the counts in the plurality of bin counters; and a phase evaluator evaluating a phase difference between the first and second signals based on the determined phase evaluation formula and the bin counts, and outputting a phase measurement signal.

7. The phase meter of claim 6, wherein the first signal has a frequency F1 and the second signal has a frequency F2 and the permuter permutes a plurality of sample phases i according to j=A*i modulo C1, where j is the permuted sample phase, C1 and C2 are integers and C2/C1 approximates F1/F2, and A=C2 modulo C1.

8. The phase meter of claim 6, wherein the plurality of phase ranges equals three, where A, B and C each equal a percentage of samples in one of the three phase ranges and having the same sample value, and where the phase of the first signal is determined to be proportional to A-B-C if C is substantially 100% and A is substantially 50%.

* * * * *